United States Patent
Sung

(10) Patent No.: US 8,816,760 B2
(45) Date of Patent: Aug. 26, 2014

(54) CAPACITOR AMPLIFYING CIRCUIT AND OPERATING METHOD THEREOF

(71) Applicant: uPI Semiconductor Corporation, Zhubei (TW)

(72) Inventor: Tsai-Yi Sung, Zhubei (TW)

(73) Assignee: UPI Semiconductor Corporation, Zhubei, Hsinchu County (TW)

( * ) Notice: Subject to any disclaimer, the term of this patent is extended or adjusted under 35 U.S.C. 154(b) by 0 days.

(21) Appl. No.: 13/787,868

(22) Filed: Mar. 7, 2013

(65) Prior Publication Data
US 2013/0241635 A1 Sep. 19, 2013

(30) Foreign Application Priority Data
Mar. 16, 2012 (TW) .............................. 101109154 A

(51) Int. Cl.
H03K 17/74 (2006.01)
H03F 99/00 (2009.01)
H03H 11/48 (2006.01)

(52) U.S. Cl.
CPC ............. *H03F 21/00* (2013.01); *H03H 11/483* (2013.01)
USPC .......................................... 327/552; 330/303

(58) Field of Classification Search
CPC ..... H03H 11/40; H03H 11/405; H03H 11/42; H03H 11/44; H03H 11/483; H03H 11/481; H03H 11/48; H03H 11/50; H03H 11/0422; H03H 11/0427; H03H 11/0461; H03H 11/0466; H03H 11/08; H03H 11/10; H03H 11/02; H03K 5/00
USPC .......................................... 327/552; 330/303
See application file for complete search history.

(56) References Cited

U.S. PATENT DOCUMENTS

| 5,650,746 A | * | 7/1997 | Soltau ........................... 327/524 |
| 5,726,599 A | * | 3/1998 | Genest .......................... 327/553 |
| 5,900,771 A | * | 5/1999 | Bremner ....................... 327/524 |
| 5,926,060 A | * | 7/1999 | Olgaard et al. ............... 327/538 |
| 6,037,843 A | * | 3/2000 | Hunt ......................... 331/177 V |
| 6,091,289 A | * | 7/2000 | Song et al. ................... 327/558 |

(Continued)

FOREIGN PATENT DOCUMENTS

TW 543290 7/2003

OTHER PUBLICATIONS

English translation of abstract of TW 543290 (published Jul. 21, 2003).

*Primary Examiner* — Thomas J Hiltunen
(74) *Attorney, Agent, or Firm* — McClure, Qualey & Rodack, LLP

(57) ABSTRACT

A capacitor amplifying circuit and an operating method thereof are disclosed. The capacitor amplifying circuit includes a first current source, a second current source, a current mirror unit, and an output capacitor. There is a proportion relationship between a first current of the first current source and a second current of the second current source. The current mirror unit is coupled between the first current source and the second current source. The current mirror unit includes N stages of current mirror circuit in series, wherein N is larger than or equal to 1. Each of the N stages of current mirror circuit has a proportional constant respectively. Two terminals of the output capacitor are coupled to the current mirror unit and a ground terminal respectively. The equivalent capacitance magnification of the output capacitor is related to the proportional constants based on the proportion relationship.

9 Claims, 7 Drawing Sheets

(56) References Cited

U.S. PATENT DOCUMENTS

| | | | |
|---|---|---|---|
| 6,778,004 B1 * | 8/2004 | Jackson | 327/538 |
| 6,788,146 B2 * | 9/2004 | Forejt et al. | 330/257 |
| 6,806,762 B2 * | 10/2004 | Stair et al. | 327/538 |
| 6,998,905 B2 * | 2/2006 | North | 327/551 |
| 7,113,020 B2 * | 9/2006 | Schoenbauer | 327/524 |
| 7,215,164 B2 * | 5/2007 | Kim | 327/147 |
| 7,307,460 B2 * | 12/2007 | Robinson et al. | 327/148 |
| 7,466,175 B2 | 12/2008 | Smith et al. | |
| 7,642,498 B2 * | 1/2010 | Zadeh | 250/208.1 |
| 7,756,279 B2 * | 7/2010 | Deruginsky et al. | 381/95 |
| 8,350,619 B2 * | 1/2013 | Morikawa | 327/558 |
| 8,487,692 B1 * | 7/2013 | Chen et al. | 327/538 |
| 8,664,973 B2 * | 3/2014 | Ali et al. | 326/30 |
| 2003/0071675 A1 * | 4/2003 | Stair et al. | 327/356 |
| 2005/0156655 A1 * | 7/2005 | Boerstler et al. | 327/379 |
| 2007/0030046 A1 * | 2/2007 | Pai et al. | 327/290 |
| 2008/0246539 A1 * | 10/2008 | Zadeh | 327/558 |
| 2012/0249191 A1 * | 10/2012 | Marie et al. | 327/111 |

* cited by examiner

CAPACITOR AMPLIFYING CIRCUIT AND OPERATING METHOD THEREOF

BACKGROUND OF THE INVENTION

1. Field of the Invention

The invention relates to a capacitor amplifier; in particular, to a capacitor amplifying circuit capable of using a current mirror circuit to achieve a capacitor amplifying function without an operational amplifier and an operating method thereof.

2. Description of the Prior Art

In general, in an analog circuit, a capacitor amplifying circuit is often used to avoid the use of a capacitor having excessive capacitance value to properly reduce the area of the integrated circuit.

Please refer to FIG. 1. FIG. 1 illustrates a schematic diagram of one type of conventional capacitor amplifying circuit. As shown in FIG. 1, the operational amplifier 30 is needed to be additionally disposed in the conventional capacitor amplifying circuit 1 used to compensate the frequency response of the amplifier 20 to make the capacitor 22 having small capacitance value C equivalent to a capacitor having large capacitance characteristics to achieve the capacitance compensation and amplification effect. However, the operational amplifier 30 additionally disposed in the conventional capacitor amplifying circuit 1 will increase cost and make the capacitor amplifying circuit 1 become more complicated.

Therefore, the invention provides a capacitor amplifying circuit and an operating method thereof to solve the above-mentioned problems occurred in the prior arts.

SUMMARY OF THE INVENTION

A scope of the invention is to provide a capacitor amplifying circuit. In a preferred embodiment, the capacitor amplifying circuit includes a first current source, a second current source, a current mirror unit, and an output capacitor. There is a proportion relationship between a first current of the first current source and a second current of the second current source. The current mirror unit is coupled between the first current source and the second current source. The current mirror unit includes N stages of current mirror circuit in series, wherein N is larger than or equal to 1. Each of the N stages of current mirror circuit has a proportional constant respectively. Two terminals of the output capacitor are coupled to the current mirror unit and a ground terminal respectively. The equivalent capacitance magnification of the output capacitor is related to the proportional constants based on the proportion relationship.

Another scope of the invention is to provide an operating method for a capacitor amplifying circuit. In a preferred embodiment, the capacitor amplifying circuit includes a first current source, a second current source, a current mirror unit, and an output capacitor. The operating method includes following steps of: (a) coupling the current mirror unit comprising N stages of current mirror circuit in series between the first current source and the second current source, wherein N is larger or equal to 1, each of the N stages of current mirror circuit has a proportional constant respectively; (b) coupling two terminals of the output capacitor to the current mirror unit and a ground terminal respectively; (c) using the first current source to provide a first current and using the second current source to provide a second current, wherein there is a proportion relationship between the first current and the second current; and (d) amplifying the output capacitor based on an equivalent capacitance magnification, wherein the equivalent capacitance magnification is related to the proportional constants based on the proportion relationship.

Compared to the prior arts, the capacitor amplifying circuit of the invention can use a current mirror circuit to amplify the capacitor having smaller capacitance value to make it equivalent to a capacitor having larger capacitance value without the operational amplifier additionally disposed in the conventional capacitor amplifying circuit. In addition, the capacitor and the current mirror circuit in the capacitor amplifying circuit of the invention are disposed between the two current sources, so that the manufacturing cost of the capacitor amplifying circuit will be reduced, and its circuit structure will become simpler and its size can be further shrunk to enhance the market competitiveness of the capacitor amplifying circuit.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

A preferred embodiment of the invention is a capacitor amplifying circuit. The capacitor amplifying circuit of the invention can be applied in an analog IC and used for compensating the frequency response of the amplifier, such as an error amplifier of a DC-DC converter, so that the amplifier can be operated at higher frequency to increase the bandwidth. In the preferred embodiment of the invention, it is not necessary to dispose additional amplifier in the capacitor amplifying circuit, the effect of capacitance equivalent compensation and amplification can be achieved by two preset fixed bias current sources, the current mirror principle, and the current operation of Kirchhoff voltage-current law (KCL/KVL).

Figure 1:
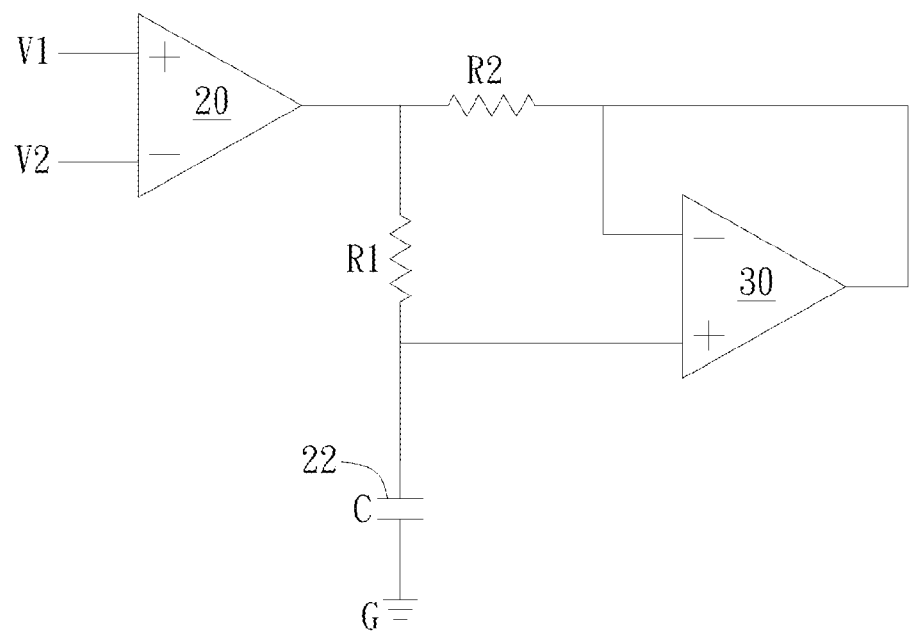
FIG. 1 illustrates a schematic diagram of one type of conventional capacitor amplifying circuit.
Figure 2:
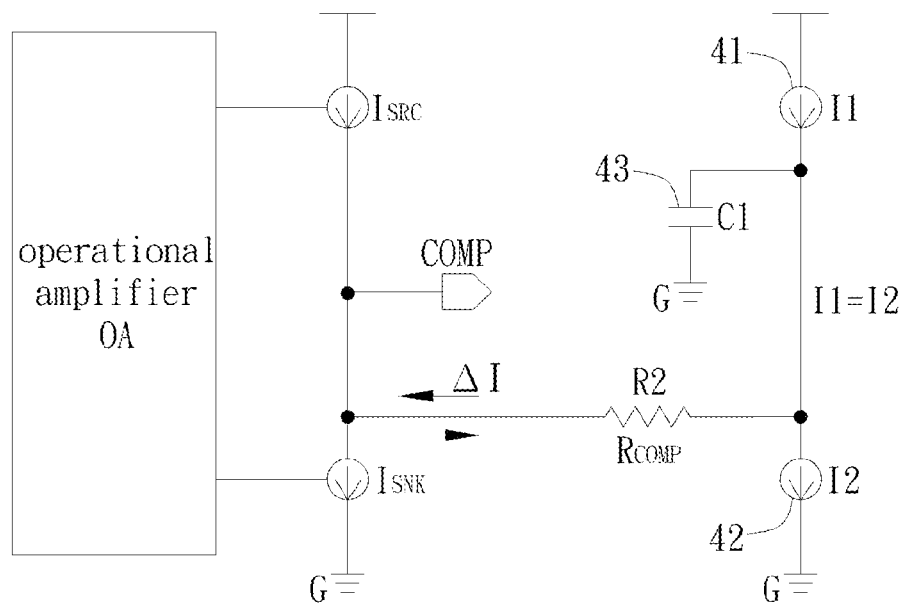
FIG. 2 illustrates a schematic diagram of a capacitor amplifying circuit not including any current mirror unit.
Figure 3:
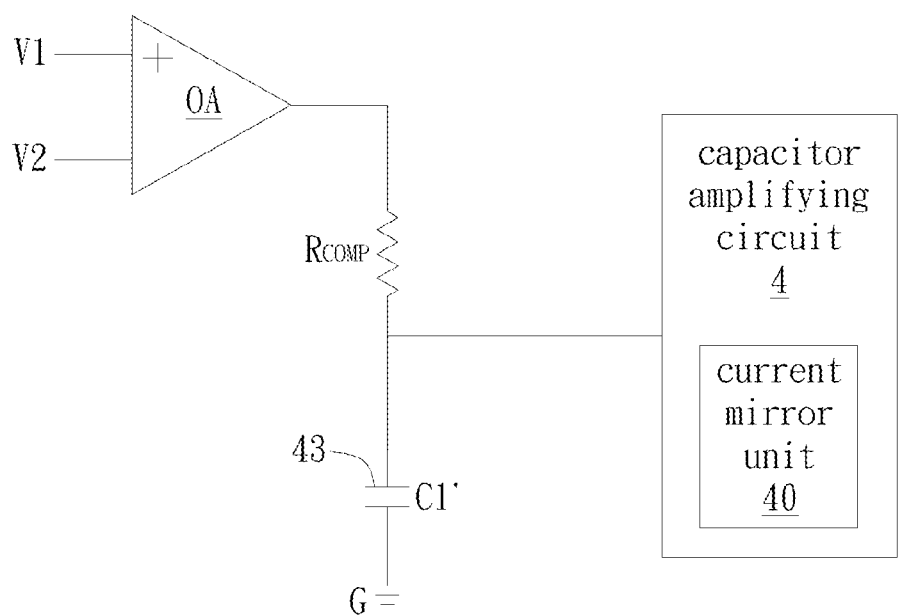
FIG. 3 illustrates an equivalent circuit diagram of the capacitor amplifying circuit in FIG. 2 further including a current mirror unit.
Figure 4:
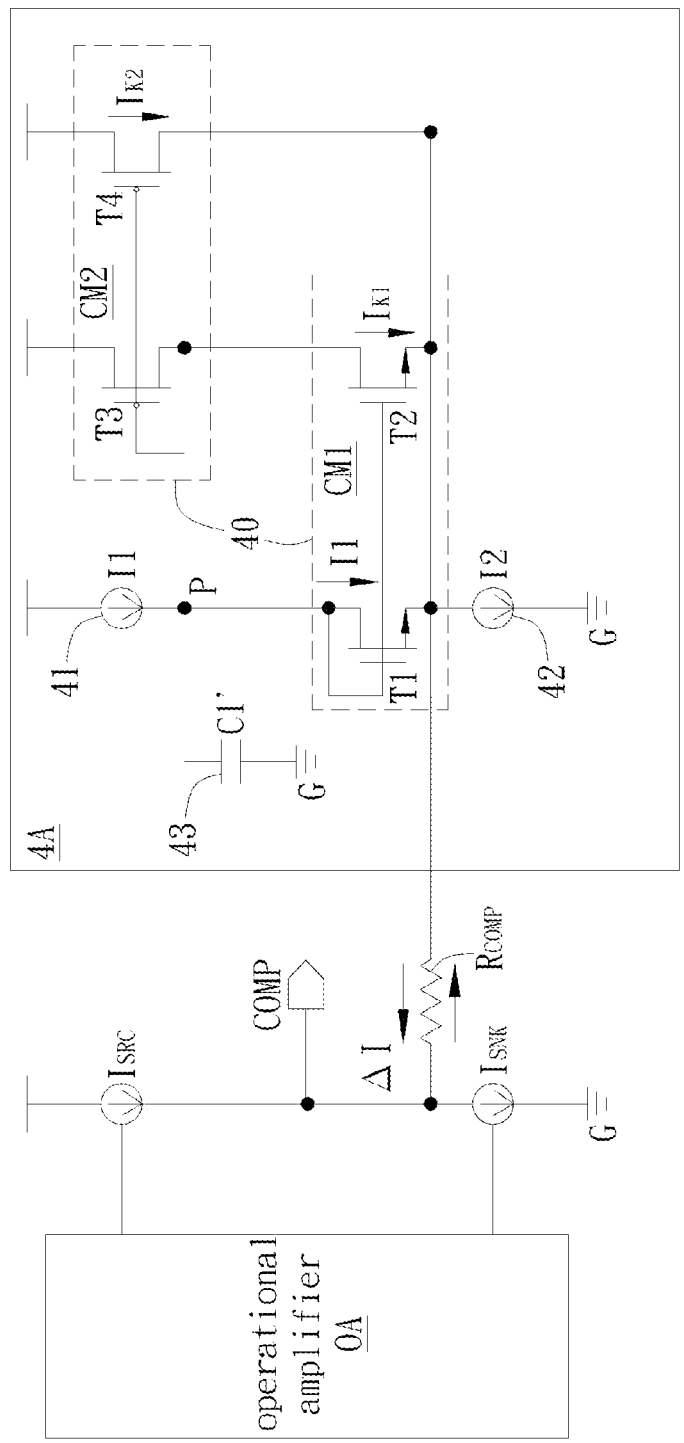
FIG. 4 illustrates an embodiment of the capacitor amplifying circuit including a second stage of current mirror circuit.

Please refer to FIG. 2 through FIG. 4. FIG. 2 illustrates a schematic diagram of a capacitor amplifying circuit not including any current mirror unit. FIG. 3 illustrates an equivalent circuit diagram of the capacitor amplifying circuit in FIG. 2 further including a current mirror unit. FIG. 4 illustrates an embodiment of the capacitor amplifying circuit including a second stage of current mirror circuit.

As shown in FIG. 2, under the condition that the capacitor amplifying circuit does not include any current mirror unit, if the operational amplifier OA to be compensated is under a stable state, at this time, ΔI=0, the first current I1 provided by the first current source 41 is equal to the second current I2 provided by the second current source 42, and the capacitance of the output capacitor 43 is C1. In this embodiment, the first current source 41 and the second current source 42 are preset fixed bias current sources, but not limited to this.

As shown in FIG. 3, the capacitor amplifying circuit 4 including the current mirror unit 40 is coupled to the output terminal of the operational amplifier OA to be compensated through a compensation resistor $R_{COMP}$, and at this time, the capacitance of the output capacitor 43 becomes C1'. In some implements, the capacitor amplifying circuit 4 can be directly coupled to the output terminal of the operational amplifier OA to be compensated without any specific limitations.

As shown in FIG. 4, the capacitor amplifying circuit 4A includes the current mirror unit 40, the first current source 41, the second current source 42, and the output capacitor 43. In this embodiment, the first current source 41 and the second current source 42 are preset fixed bias current sources used for providing the fixed first current I1 and the fixed second current I2 respectively. The current mirror unit 40 includes two stages of current mirror circuit: the first stage of current mirror circuit CM1 and the second stage of current mirror circuit CM2 connected in series. In this embodiment, the first stage of current mirror circuit CM1 is coupled to the output terminal of the operational amplifier OA to be compensated through a compensation resistor $R_{COMP}$, and the first stage of current mirror circuit CM1 is coupled to the first current source 41 and the second current source 42 respectively. Two terminals of the output capacitor 43 are coupled to the ground terminal G and the node P between the first stage of current mirror circuit CM1 and the first current source 41 respectively. In other embodiments, the first stage of current mirror circuit CM1 can be directly coupled to the output terminal of the operational amplifier OA to be compensated; one terminal of the output capacitor 43 can be coupled to the node between the first stage of current mirror circuit CM1 and the second current source 42, but not limited to this.

In this embodiment, the first stage of current mirror circuit CM1 includes a first switch T1 and a second switch T2, and the gates of the first switch T1 and the second switch T2 are connected; the second stage of current mirror circuit CM2 includes a third switch T3 and a fourth switch T4, and the gates of the third switch T3 and the fourth switch T4 are connected. In practical applications, the first switch T1, the second switch T2, the third switch T3, and the fourth switch T4 are transistors, such as P-MOSFET or N-MOSFET, but not limited to this.

The source and drain of the first switch T1 of the first stage of current mirror circuit CM1 are coupled to the first current source 41 and the second current source 42 respectively; the source and drain of the second switch T2 are coupled to the third switch T3 of the second stage of current mirror circuit CM2 and the second current source 42 respectively; the fourth switch T4 of the second stage of current mirror circuit CM2 is coupled to the second current source 42.

Capacitance means the ability (or capacity) of the capacitor to store charges. The amount of charge Q that the capacitor can store is proportional to its electric potential V, namely $$Q=C*V \quad (1)$$

Wherein, the proportional constant C in the formula (1) is the capacitance of the capacitor, referred to as the capacitance. In addition, the physical constant current formula is $$I=Q/T \quad (2)$$

Wherein, I is the current; Q is the amount of charge; T is the unit time. From the formulas (1) and (2), it can be obtained:

$$I*T=C*V \quad (3)$$

In detail, the invention is based on the above-mentioned formulas (1), (2), and (3) and uses two preset fixed bias current sources and the current mirror proportional relationships based on Kirchhoff voltage-current law. It first establishes the DC bias current proportional relationship according to the set N current mirror proportional relationships, and the AC current will also comply with the DC current proportional relationship and use this relationship to achieve the capacitance compensation and amplification effect.

Taking FIG. 4 for example, the first stage of current mirror circuit CM1 and the second stage of current mirror circuit CM2 have a first proportional constant K1 and a second proportional constant K2 respectively. That is to say, the first stage of current mirror circuit CM1 having the first proportional constant K1 means the proportion between the fixed first current I1 flowing through the first switch T1 and the current $I_{K1}$ flowing through the second switch T2 is 1:K1; the second stage of current mirror circuit CM2 having the second proportional constant K2 means the proportion between the current $I_{K1}$ flowing through the third switch T3 and the current $I_{K2}$ flowing through the fourth switch T4 is 1:K2.

If the current mirror unit 40 including the first stage of current mirror circuit CM1 and the second stage of current mirror circuit CM2 and the operational amplifier OA to be compensated are all under the stable state, at this time, ΔI=0. According to Kirchhoff's Law, it can be obtained that:

$$I1+I_{K1}+I_{K2}=I2 \quad (4)$$

According to the current mirror proportional relationship, it can be obtained that:

$$I_{K1}=K1*I1 \quad (5)$$

$$I_{K2}=K2*I_{K1}=K2*(K1*I1) \quad (6)$$

Putting the formulas (5) and (6) into the formula (4), it can be obtained that:

$$I2=I1*[1+K1*(1+K2)]$$

$$\text{namely, } I1=I2/[1+K1*(1+K2)] \quad (7)$$

From the formula (3), it can be obtained that under the same time T and the same capacitor electric potential V, the current I is proportional to the capacitance of the capacitor C. Therefore, from the formulas (3) and (7), it can be obtained that when the current mirror unit 40 includes the first stage of current mirror circuit CM1 and the second stage of current mirror circuit CM2, the capacitance C1' of the output capacitor 43 will be:

$$C1'=C1/[1+K1*(1+K2)] \quad (8)$$

The first current I1 is equal to the second current I2 under the condition without any current mirror unit shown in FIG. 2. The first current I1' will become 1/[1+K1*(1+K2)] time of the first current I1 of FIG. 2 under the condition that the current mirror unit 40 includes the first stage of current mirror circuit CM1 and the second stage of current mirror circuit CM2 shown in FIG. 4. Therefore, according to the formula (3), it can be found that under the condition shown in FIG. 4, the capacitance C1' of the output capacitor 43 will become 1/[1+K1*(1+K2)] time of the capacitance C1 of the output capacitor 43 shown in FIG. 2. It can be introduced as follows:

Under the condition without any current mirror unit shown in FIG. 2, $$I1*T=C1*V(I1=I=2) \quad (9)$$

Under the condition that the current mirror unit 40 includes the first stage of current mirror circuit CM1 and the second stage of current mirror circuit CM2 shown in FIG. 4, $$I1'*T=C1'*V$$

$$\{I1/[1+K1*(1+K2)]\}*T=\{1+K1*(1+K2)\}*V$$

$$I1*T=C1*V \quad (10)$$

From above, it can be found that the formula (9) is the same with the formula (10), that is to say, under the condition that the current mirror unit 40 includes the first stage of current mirror circuit CM1 and the second stage of current mirror circuit CM2 shown in FIG. 4, the current will become $1/[1+K1*(1+K2)]$ time of the current under the condition without any current mirror unit shown in FIG. 2, and its equivalent capacitance will also become $1/[1+K1*(1+K2)]$ time of the equivalent capacitance under the condition without any current mirror unit shown in FIG. 2. Therefore, as shown in FIG. 4, the capacitor amplifying circuit 4A can equivalently amplify the smaller capacitance of the original output capacitor 43 $[1+K1*(1+K2)]$ time through the first stage of current mirror circuit CM1 and the second stage of current mirror circuit CM2 of the current mirror unit 40 to achieve the capacitance compensation and amplification effect.

If taking practical data as example, if the first current I1=the second current I2=100 μA and the capacitance C1=100 pF in FIG. 2, the first proportional constant K1=the second proportional constant K2=10 in FIG. 4. If it is under the same unit time T and the capacitor electric potential V, it can be obtained by applying the formula (3) to FIG. 2:

$$100 \mu A*T=100 pF*V$$

It can be obtained by applying the formula (3) to FIG. 4:

$$100 \mu A/[1+10*(1+10)]*T=100 pF/[1+10*(1+10)]*V$$

namely, $100 \mu A*T=100 pF*V$

Therefore, from above, it can be obtained that the capacitor amplifying circuit 4A can equivalently amplify the smaller capacitance of the output capacitor 43 through the first stage of current mirror circuit CM1 and the second stage of current mirror circuit CM2 of the current mirror unit 40 to make it have the same effect with the larger capacitance of the output capacitor 43 under the condition without any current mirror unit shown in FIG. 2. And, the equivalent capacitance magnification of the output capacitor 43 is related to the first proportional constant K1 of the first stage of current mirror circuit CM1 and the second proportional constant K2 of the second stage of current mirror circuit CM2 in the current mirror unit 40.

If taking the two stages of current mirror circuit (the first stage of current mirror circuit CM1 and the second stage of current mirror circuit CM2) of the current mirror unit 40 as example, its equivalent capacitance is equal to $C1*[1+K1*(1+K2)]$, that is to say, its equivalent capacitance magnification is $[1+K1*(1+K2)]$. Therefore, its equivalent capacitance magnification is related to the first proportional constant K1 of the first stage of current mirror circuit CM1 and the second proportional constant K2 of the second stage of current mirror circuit CM2 in the current mirror unit 40.

Figure 5:
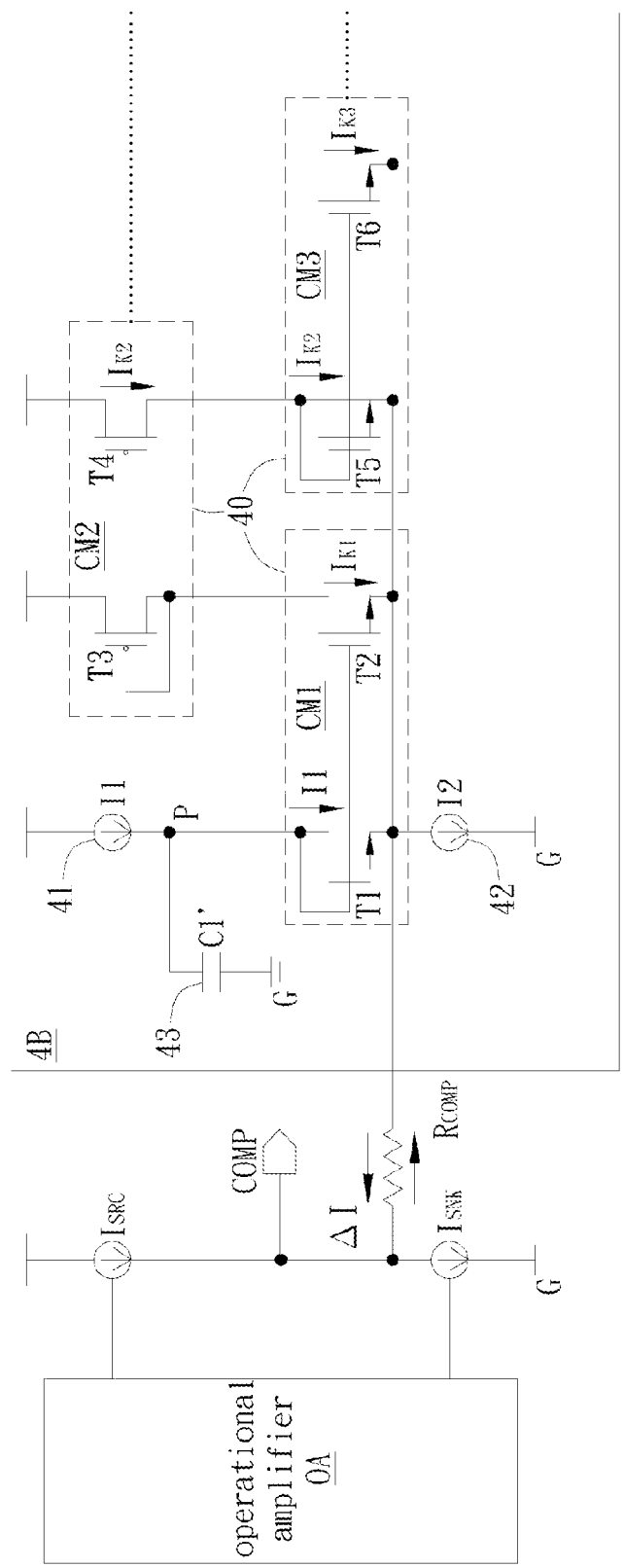
FIG. 5 illustrates an embodiment of the capacitor amplifying circuit including an Nth stage of current mirror circuit.

Similarly, if taking the capacitor amplifying circuit 4B in FIG. 5 as example, its current mirror unit 40 includes N stages of current mirror circuit, for example, it includes three stages of current mirror circuit (the first stage of current mirror circuit CM1, the second stage of current mirror circuit CM2, and the third stage of current mirror circuit CM3), and N is any positive integer. From above, it can be found that its equivalent capacitance is equal to $C1*[1+K1*(1+K2+K2*K3+K2*K3*K4+ \ldots +K2*K3*K4* \ldots *KN)]$, namely its equivalent capacitance magnification is $[1+K1*(1+K2+K2*K3+K2*K3*K4+ \ldots +K2*K3*K4* \ldots *KN)]$. Therefore, its equivalent capacitance magnification is related to the proportional constants K1~KN of the N stages of current mirror circuit CM1~CMN connected in series in the current mirror unit 40.

Figure 6:
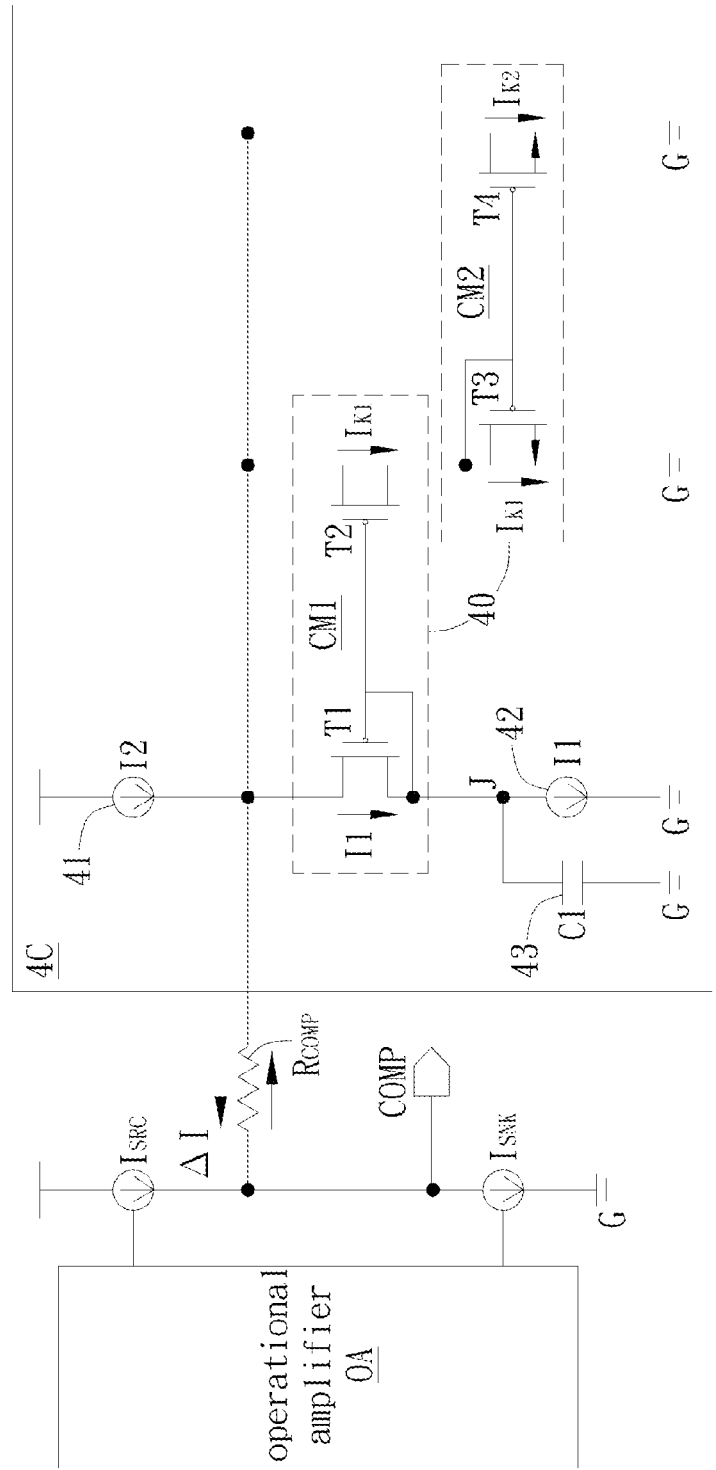
FIG. 6 illustrates another embodiment of the capacitor amplifying circuit including a second stage of current mirror circuit.
Figure 7:
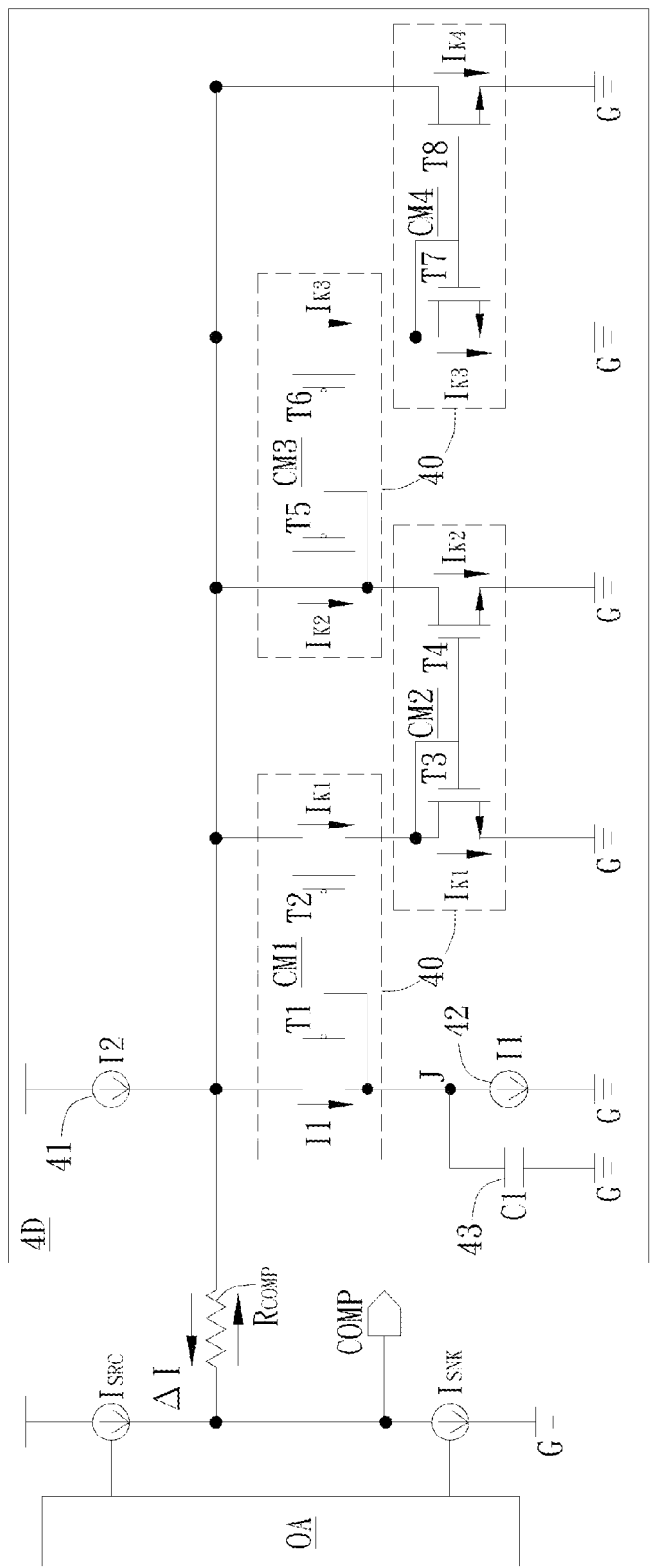
FIG. 7 illustrates another embodiment of the capacitor amplifying circuit including an Nth stage of current mirror circuit.

In practical applications, one terminal of the output capacitor 43 can be not only coupled to the node P between the first stage of current mirror circuit CM1 and the first current source 41 as shown in FIG. 4 and FIG. 5, but also coupled to the node J between the first stage of current mirror circuit CM1 and the second current source 42 as shown in FIG. 6 and FIG. 7. If taking the capacitor amplifying circuit 4C in FIG. 6 as example, if the current mirror unit 40 including the first stage of current mirror circuit CM1 and the second stage of current mirror circuit CM2 and the operational amplifier OA to be compensated are all under the stable state, at this time, ΔI=0. According to Kirchhoff's Law, it can be obtained that:

$$I2=I1+I_{K1}+I_{K2}$$

Since the other derivation courses are similar to the above-mentioned embodiment, it does not further go into details. Finally, the result that its equivalent capacitance is equal to $C1*[1+K1*(1+K2)]$ will be obtained.

If taking the capacitor amplifying circuit 4D in FIG. 7 as example, if the current mirror unit 40 including the first stage of current mirror circuit CM1 through the fourth stage of current mirror circuit CM4 and the operational amplifier OA to be compensated are all under the stable state, at this time, ΔI=0. According to Kirchhoff's Law, it can be obtained that:

$$I2=I1+I_{K1}+I_{K2}+I_{K3}+I_{K4}$$

Since the other derivation courses are similar to the above-mentioned embodiment, it does not further go into details. Finally, the result that its equivalent capacitance is equal to $C1*[1+K1*(1+K2+K2*K3+K2*K3*K4)]$ will be obtained.

Furthermore, as shown in FIG. 4, if the operational amplifier OA to be compensated is not under the stable state, at this time, it will have the source/sink functions of the output current source, and the current changing amount ΔI is not equal to 0. If the operational amplifier OA is under the source current condition, it can be obtained according to Kirchhoff's Law and the current mirror proportional relationships:

$$\Delta I=gm*\Delta V=\Delta I1+\Delta I_{K1}+\Delta I_{K2}$$

$$\Delta I1=\Delta I*\{1/[1+K1*(1+K2)]\}$$

$$\Delta I_{K1}=\Delta I*\{K1/[1+K1*(1+K2)]\}$$

$$\Delta I_{K2}=\Delta I*\{K1*K2/[1+K1*(1+K2)]\}$$

Wherein, gm is the transconductance of the operational amplifier OA to be compensated; ΔV is the voltage variation generated when the operational amplifier OA sources current; ΔI is the current variation generated when the operational amplifier OA sources current; ΔI1 is the current variation generated when the operational amplifier OA distributed on the current path the of first current I1 sources current; $\Delta I_{K1}$ is the current variation generated when the operational amplifier OA distributed on the current path the of current $I_{K1}$ sources current; $\Delta I_{K2}$ is the current variation generated when the operational amplifier OA distributed on the current path the of current $I_{K2}$ sources current.

Because the small signal current variation on the output capacitor 43 is ΔI1, under the same unit time T and the same capacitor electric potential V, it can be obtained based on the formula (3) that the capacitance variation of the output capacitor 43 is in multiples of the current variation ΔI1, and its AC current equivalent result will be the same with the DC analysis capacitive equivalent amplification principle. This result can let the operational amplifier OA operated under higher frequency to increase the bandwidth. Similarly, the above-mentioned analysis can be also applied to the operational amplifier OA operated under the current draining state, and the result is the same.

Figure 8:
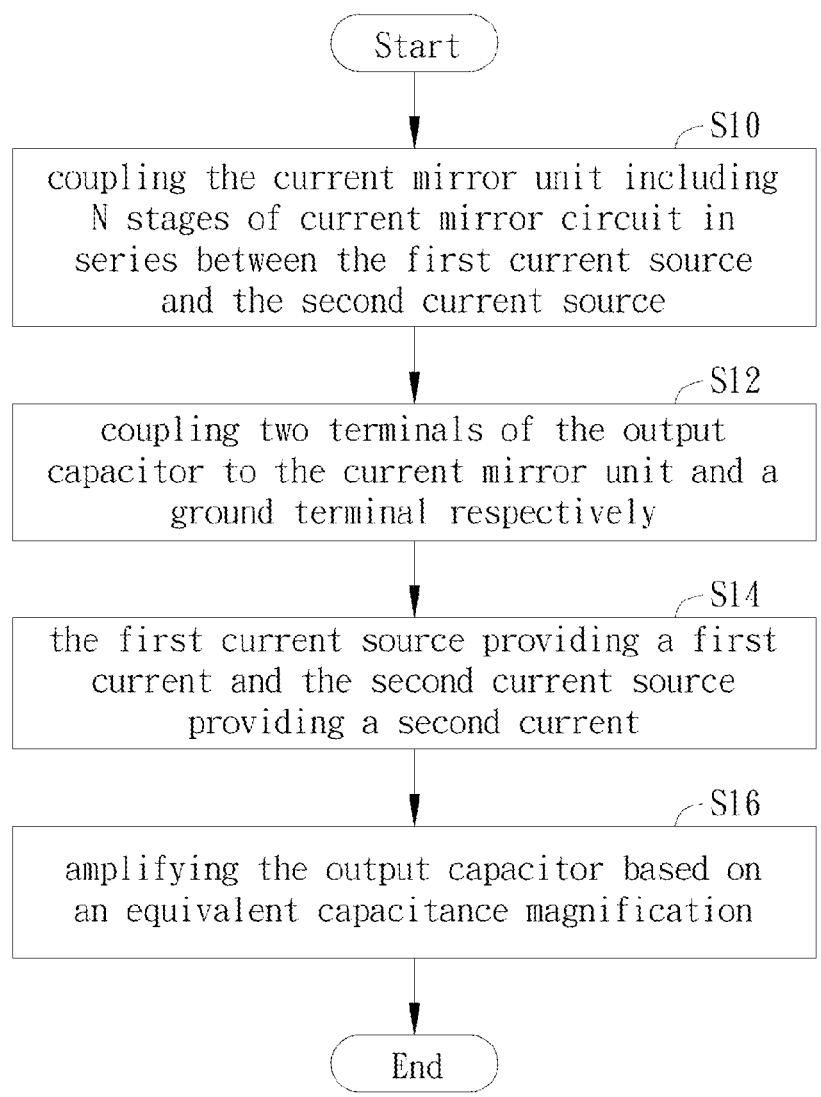
FIG. 8 illustrates a flowchart of the capacitor amplifying circuit operating method in another embodiment of the invention.

Another embodiment of the invention is a capacitor amplifying circuit operating method. In this embodiment, the capacitor amplifying circuit includes a first current source, a second current source, a current mirror unit, and an output capacitor. Please refer to FIG. 8. FIG. 8 illustrates a flowchart of the capacitor amplifying circuit operating method in this embodiment. As shown in FIG. 8, in the step S10, the method couples the current mirror unit including N stages of current mirror circuit in series between the first current source and the second current source, wherein N is larger or equal to 1, and each of the N stages of current mirror circuit has a proportional constant respectively.

For example, as shown in FIG. 4, if N is equal to 2, namely the current mirror unit 40 of the capacitor amplifying circuit 4A includes two stages of current mirror circuit (the first stage of current mirror circuit CM1 and the second stage of current mirror circuit CM2) connected in series. The method couples the first stage of current mirror circuit CM1 of the current mirror unit 40 between the first current source 41 and the second current source 42, and the first stage of current mirror circuit CM1 and the second stage of current mirror circuit CM2 have the first proportional constant K1 and the second proportional constant K2 respectively. That is to say, the first stage of current mirror circuit CM1 having the first proportional constant K1 means that the proportion between the fixed first current I1 flowing through the first switch T1 and the current $I_{K1}$ flowing through the second switch T2 is 1:K1; the second stage of current mirror circuit CM2 having the second proportional constant K2 means the proportion between the current $I_{K1}$ flowing through the third switch T3 and the current $I_{K2}$ flowing through the fourth switch T4 is 1:K2.

In the step S12, the method couples two terminals of the output capacitor to the current mirror unit and a ground terminal respectively. More detail, one terminal of the output capacitor 43 is coupled to the ground terminal G, and the other terminal of the output capacitor 43 can be coupled to the node P between the first stage of current mirror circuit CM1 and the first current source 41 as shown in FIG. 4 or to the node J between the first stage of current mirror circuit CM1 and the second current source 42 as shown in FIG. 6.

In the step S14, the first current source provides a first current and the second current source provides a second current, wherein there is a proportion relationship between the first current and the second current. In fact, the first current source and the second current source are preset fixed bias current sources. For example, as shown in FIG. 4, the first current source 41 and the second current source 42 are preset fixed bias current sources for providing fixed first current I1 and second current I2 respectively. As to the proportional relationship between the first current I1 and the second current I2, it can be determined based on practical needs without any specific limitations.

In the step S16, the method amplifies the output capacitor based on an equivalent capacitance magnification, wherein the equivalent capacitance magnification is related to the proportional constants based on the proportion relationship. Taking the two stages of current mirror circuit (the first stage of current mirror circuit CM1 and the second stage of current mirror circuit CM2) of the current mirror unit 40, it can be obtained based on the above-mentioned embodiments that its equivalent capacitance is equal to C1*[1+K1*(1+K2)], namely its equivalent capacitance magnification is equal to [1+K1*(1+K2)]. Therefore, it can be found that its equivalent capacitance magnification is related to the first proportional constant K1 of the first stage of current mirror circuit CM1 and the second proportional constant K2 of the second stage of current mirror circuit CM2.

Compared to the prior arts, the capacitor amplifying circuit of the invention uses a current mirror circuit to compensate and amplify the capacitor having smaller capacitance value to make it equivalent to a capacitor having larger capacitance value without the operational amplifier additionally disposed in the conventional capacitor amplifying circuit. In addition, the capacitor and the current mirror circuit in the capacitor amplifying circuit of the invention are disposed between the two current sources, so that the manufacturing cost of the capacitor amplifying circuit will be reduced, and its circuit structure will become simpler and its size can be further shrunk to enhance the market competitiveness of the capacitor amplifying circuit.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A capacitor amplifying circuit, comprising:
    a first current source, for providing a first current;
    a second current source, for providing a second current, wherein there is a proportion relationship between the first current and the second current;
    a current mirror unit, coupled between the first current source and the second current source, the current mirror unit comprising N stages of current mirror circuit in series, wherein N is larger than or equal to 1, each of the N stages of current mirror circuit has a proportional constant respectively; and
    an output capacitor coupled between one of the first current source and the second current source and the current mirror unit;
    wherein an equivalent capacitance magnification of the output capacitor is related to the proportional constants based on the proportion relationship, the N stages of current mirror circuit comprise a first stage of current mirror circuit, a second stage of current mirror circuit, and a Nth stage of current mirror circuit, the first stage of current mirror circuit is coupled to an output terminal of an amplifier, and the first stage of current mirror circuit is coupled to the first current source and the second current source respectively.

2. The capacitor amplifying circuit of claim 1, wherein the first current source and the second current source are preset fixed bias current sources.

3. The capacitor amplifying circuit of claim 1, wherein if the first stage of current mirror circuit through the Nth stage of current mirror circuit have a first proportional constant K1 through a Nth proportional constant KN respectively, the proportion relationship is that the second current is [1+K1*(1+K2+K2*K3+ . . . +K2*K3*K4* . . . *KN)] times of the first current, and the equivalent capacitance magnification of the output capacitor is [1+K1*(1+K2+K2*K3+ . . . +K2*K3*K4* . . . *KN)].

4. The capacitor amplifying circuit of claim 1, wherein the output capacitor is coupled between the first stage of current mirror circuit and the first current source.

5. The capacitor amplifying circuit of claim 1, wherein the output capacitor is coupled between the first stage of current mirror circuit and the second current source.

6. The capacitor amplifying circuit of claim 1, wherein when the current mirror unit and the amplifier are both under stable state, an output current from the output terminal of the amplifier is 0.

7. An operating method for a capacitor amplifying circuit, used for operating a capacitor amplifying circuit, the capacitor amplifying circuit comprising a first current source, a second current source, a current mirror unit, and an output capacitor, the operating method comprising steps of:
  (a) coupling the current mirror unit comprising N stages of current mirror circuit in series between the first current source and the second current source, wherein N is larger or equal to 1, each of the N stages of current mirror circuit has a proportional constant respectively;
  (b) coupling the output capacitor between one of the first current source and the second current source and the current mirror unit;
  (c) using the first current source to provide a first current and using the second current source to provide a second current, wherein there is a proportion relationship between the first current and the second current; and
  (d) amplifying the output capacitor based on an equivalent capacitance magnification, wherein the equivalent capacitance magnification is related to the proportional constants based on the proportion relationship, the N stages of current mirror circuit comprise a first stage of current mirror circuit, a second stage of current mirror circuit, and a Nth stage of current mirror circuit, the step (a) further comprises directly coupling the first stage of current mirror circuit to an output terminal of an amplifier or coupling the first stage of current mirror circuit to the output terminal of the amplifier through a compensation resistor, and coupling the first stage of current mirror circuit to the first current source and the second current source respectively.

8. The operating method of claim 7, wherein if the first stage of current mirror circuit through the Nth stage of current mirror circuit have a first proportional constant K1 through a Nth proportional constant KN respectively, the proportion relationship in the step (c) comprises that the second current is [1+K1*(1+K2+K2*K3+ ... +K2*K3*K4* ... *KN)] times of the first current, and the equivalent capacitance magnification of the output capacitor in step (d) is [1+K1*(1+K2+K2*K3+ ... +K2*K3*K4* ... *KN)].

9. The operating method of claim 8, wherein the step (b) comprises coupling the output capacitor between the first stage of current mirror circuit and the first current source or between the first stage of current mirror circuit and the second current source.

* * * * *